(12) United States Patent
Bae et al.

(10) Patent No.: US 8,816,487 B2
(45) Date of Patent: Aug. 26, 2014

(54) INTEGRATED CIRCUIT PACKAGING SYSTEM WITH PACKAGE-IN-PACKAGE AND METHOD OF MANUFACTURE THEREOF

(75) Inventors: Hyunil Bae, Chungchung-do (KR); YoungChul Kim, Yongin-si (KR); Myung Kil Lee, Seoul (KR)

(73) Assignee: STATS ChipPAC Ltd., Singapore (SG)

( * ) Notice: Subject to any disclaimer, the term of this patent is extended or adjusted under 35 U.S.C. 154(b) by 167 days.

(21) Appl. No.: 12/404,279

(22) Filed: Mar. 13, 2009

(65) Prior Publication Data

US 2009/0236723 A1 Sep. 24, 2009

Related U.S. Application Data

(60) Provisional application No. 61/037,702, filed on Mar. 18, 2008.

(51) Int. Cl.
*H01L 23/02* (2006.01)

(52) U.S. Cl.
USPC .......................................... 257/686; 257/777

(58) Field of Classification Search
USPC .................................................. 257/686, 777
See application file for complete search history.

(56) References Cited

U.S. PATENT DOCUMENTS

| 6,906,416 | B2 | 6/2005 | Karnezos | |
|---|---|---|---|---|
| 6,933,598 | B2 | 8/2005 | Karnezos | |
| 6,951,774 | B2 | 10/2005 | Nakamura et al. | |
| 7,101,731 | B2 | 9/2006 | Karnezos | |
| 2006/0131719 | A1* | 6/2006 | Nakayama | 257/686 |
| 2006/0186524 | A1* | 8/2006 | Aiba et al. | 257/686 |
| 2007/0052082 | A1 | 3/2007 | Lee et al. | |
| 2007/0194423 | A1* | 8/2007 | Yim et al. | 257/686 |
| 2007/0257377 | A1* | 11/2007 | Chen et al. | 257/786 |
| 2008/0157331 | A1* | 7/2008 | Onodera | 257/686 |
| 2008/0197470 | A1* | 8/2008 | Yoshimura et al. | 257/686 |
| 2008/0203566 | A1* | 8/2008 | Su | 257/738 |
| 2009/0051019 | A1* | 2/2009 | Huang et al. | 257/676 |
| 2009/0152701 | A1* | 6/2009 | Kuan et al. | 257/686 |
| 2009/0212442 | A1* | 8/2009 | Chow et al. | 257/777 |
| 2009/0224390 | A1* | 9/2009 | Yang et al. | 257/686 |

* cited by examiner

*Primary Examiner* — Phat X Cao
(74) *Attorney, Agent, or Firm* — Ishimaru & Associates LLP

(57) ABSTRACT

A method of manufacture of an integrated circuit packaging system includes: providing a package substrate, having a component side and a system side; mounting a first integrated circuit die on the component side of the package substrate; mounting a second integrated circuit die on the component side of the package substrate; mounting an internal package, having an internal die, over the first integrated circuit die; coupling chip interconnects between the first integrated circuit die, the second integrated circuit die, the internal die, the component side, or a combination thereof, and forming a stacked package body by encapsulating the component side, the first integrated circuit die, the second integrated circuit die, the internal package, and the chip interconnects.

16 Claims, 5 Drawing Sheets

INTEGRATED CIRCUIT PACKAGING SYSTEM WITH PACKAGE-IN-PACKAGE AND METHOD OF MANUFACTURE THEREOF

CROSS-REFERENCE TO RELATED APPLICATION

This application claims the benefit of U.S. Provisional Patent Application Ser. No. 61/037,702 filed Mar. 18, 2008, and the subject matter thereof is incorporated herein by reference thereto.

TECHNICAL FIELD

The present invention relates generally to an integrated circuit packaging system and more particularly to a system for stacked devices.

BACKGROUND ART

The integrated circuit package is the building block used in a high performance electronic system to provide applications for usage in products such as smart phones, pocket personal computers, intelligent portable military devices, aeronautical spacecraft payloads, and a vast line of other similar products that require small compact electronics supporting many complex functions.

The integrated circuit, such as a chip or die, contains circuitry that is designed to perform various functions in the high performance electronic system. Products having small dimensional requirements and many complex functions rely on limited size, limited quantity, and high input output (IO) connectivity integrated circuit packages.

The integrated circuit package can consist of a package base or package substrate providing a mounting structure on which at least one chip or die is attached and an enclosure such as an epoxy applied on it to protect its contents.

The other side of the chip or die, referred to as an active surface of the chip or die, has electrically conductive areas that provide for electrical connections to its circuitry. Connectors, consisting of electrically conductive material, attach to the conductive areas to provide electrical connection between the circuitry of the chip or die and other circuitry not of the same chip or die.

The other circuitry can be from several possible sources. One possible source can be circuitry resident within the integrated circuit package, such as from another chip, indicative of a multiple chip integrated circuit package. Another possible source can be of circuitry residing outside the integrated circuit package such as from a printed circuit board within the electronic system.

Yet another possible source can be circuitry from one or more separate integrated circuit packages having one or more chips or dice within it. The separate integrated circuit packages can be connected with the conductors and enclosed together resulting in a single sealed package structure, or can be externally connected onto the single sealed package structure.

Integrated circuit packages with small footprints and high internal IO connectivity are sought after for products with small printed circuit board systems. Global market demands also require solutions that provide lower costs and higher reliability through simplified manufacturing processing and early testing of circuitry for known good die (KGD) during fabrication which result in higher yield and improved circuitry reliability. Also, the leverage and flexibility provided by replacing package components as needed contribute to market leadership.

Flipchip fabrication technology is becoming more advanced as more chips or die are integrated into a single package. Similarly, package assembly should have more advanced designs for simple package applications with more functional chips in combination. However, due to the difficulty of flipchip fabrications, generally only single flipchip applications have been produced in high volume manufacturing production.

Attempts have failed to provide a complete solution addressing simplified manufacturing processing, smaller dimensions, lower costs due to design flexibility, reduced package counts, increased functionality, leveragability, and increased IO connectivity capabilities.

In view of the ever-increasing commercial competitive pressures, along with growing consumer expectations and the diminishing opportunities for meaningful product differentiation in the marketplace, it is critical that answers be found for these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system that includes: providing a package substrate, having a component side and a system side; mounting a first integrated circuit die on the component side of the package substrate; mounting a second integrated circuit die on the component side of the package substrate; mounting an internal package, having an internal die, over the first integrated circuit die; coupling chip interconnects between the first integrated circuit die, the second integrated circuit die, the internal die, the component side, or a combination thereof, and forming a stacked package body by encapsulating the component side, the first integrated circuit die, the second integrated circuit die, the internal package, and the chip interconnects.

The present invention provides an integrated circuit packaging system including: a package substrate, having a component side and a system side; a first integrated circuit die mounted on the component side of the package substrate; a second integrated circuit die mounted on the component side of the package substrate; an internal package, having an internal die, mounted over the first integrated circuit die; chip interconnects between the first integrated circuit die, the second integrated circuit die, the internal die, the component side, or a combination thereof, and a stacked package body formed by encapsulant on the component side, the first integrated circuit die, the second integrated circuit die, the internal package, and the chip interconnects.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
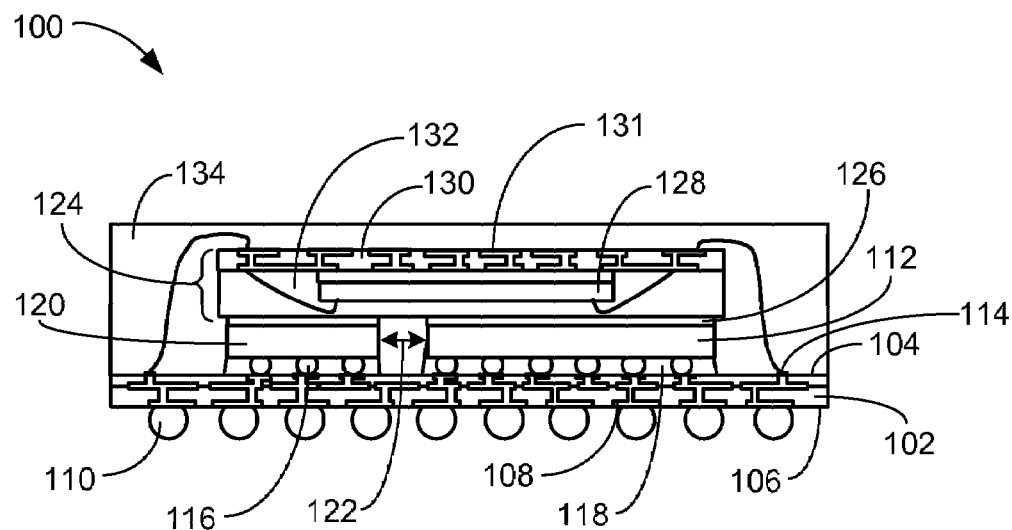
FIG. 1 is a cross-sectional view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGS. Similarly, although the views in the drawings for ease of description generally show similar orientations, this depiction in the FIGS. is arbitrary for the most part. Generally, the invention can be operated in any orientation.

Where multiple embodiments are disclosed and described, having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the package substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures. The term "on" means that there is direct contact among elements.

The term "processing" as used herein includes deposition of material or photoresist, patterning, exposure, development, etching, cleaning, and/or removal of the material or photoresist as required in forming a described structure.

Referring now to FIG. 1, therein is shown a cross-sectional view of an integrated circuit packaging system 100 in a first embodiment of the present invention. The cross-sectional of the integrated circuit packaging system 100 depicts a package substrate 102 having a component side 104 and a system side 106. System contacts 108 on the system side 106 may have system interconnects 110, such as solder balls, solder bumps, solder columns, or stud bumps, provided for attaching to the next level system (not shown).

A first integrated circuit die 112, such as a flip chip die, may be coupled to component contacts 114, on the component side 104 of the package substrate 102, by chip interconnects 116. The chip interconnects 116 may include bond wires, solder balls, solder bumps, solder columns, or stud bumps. A sealant 118, such as an underfill material, may be injected around the chip interconnects 116 and between the component side 104 and the first integrated circuit die 112.

A second integrated circuit die 120, such as a flip chip die, may be coupled to the component contacts 114, on the component side 104 of the package substrate 102, by the chip interconnects 116. The second integrated circuit die 120 may be positioned horizontally adjacent to and spaced from the first integrated circuit die 112 to form a gap 122 between the first integrated circuit die 112 and the second integrated circuit die 120. The second integrated circuit die 120 can electrically connect to the package substrate 102 with a bond wire located on a side of the second integrated circuit die 120 facing away from the first integrated circuit die 112. The sealant 118 may be injected around the chip interconnects 116 and between the component side 104 and the second integrated circuit die 120.

An internal package 124, such as a quad flatpack-no lead (QFN) or a ball grid array (BGA) package, may be mounted on the first integrated circuit die 112 and the second integrated circuit die 120 in an inverted position. An adhesive 126 may be applied between the internal package 124, the first integrated circuit die 112 and the second integrated circuit die 120.

The internal package 124 may have one or more of an internal die 128 electrically connected to an internal package substrate 130, providing internal package contacts 131, and encapsulated by an internal package body 132, such as formed from an epoxy molding compound. The internal package contacts 131 are on a side of the internal package 124 opposite of the first integrated circuit die 112. Further, the internal package contacts 131 can be on the side of the internal package 124 exposed from the internal package body 132. While the internal package 124 is shown with a single wire bond type of integrated circuit, this is an example only and other configurations are possible.

The internal package substrate 130 may be electrically connected to the component side 104 of the package substrate 102, by the chip interconnects 116. This configuration allows a signal connection to be formed between the system interconnects 110, the first integrated circuit die 112, the second integrated circuit die 120, the internal die 128, or a combination thereof.

A stacked package body 134 may be formed by molding the epoxy molding compound fully encapsulating the component side 104 of the package substrate 102, the first integrated circuit die 112, the second integrated circuit die 120, the internal package 124, the chip interconnects 116, the sealant 118, the adhesive 126, and through the gap 122. Further, the stacked package body 134 can fully encapsulate the internal package contacts 131. The stacked package body 134, while possibly formed of the same material as the internal package body 132, remains identifiably different from the internal package body 132 because their boundary can be identified in cross-section.

It has been discovered that the configuration of the integrated circuit packaging system 100 may provide an extremely low profile package while supplying high functional density. This invention simplifies the design of the next level system by combining functions and reducing the number of interconnects required on the system printed circuit board (not shown). Thus, it has been discovered that the integrated circuit packaging method and device of the present invention furnishes important and heretofore unknown and unavailable solutions, capabilities, and functional aspects for manufacturing high density and low profile package-in-package devices.

Figure 2:
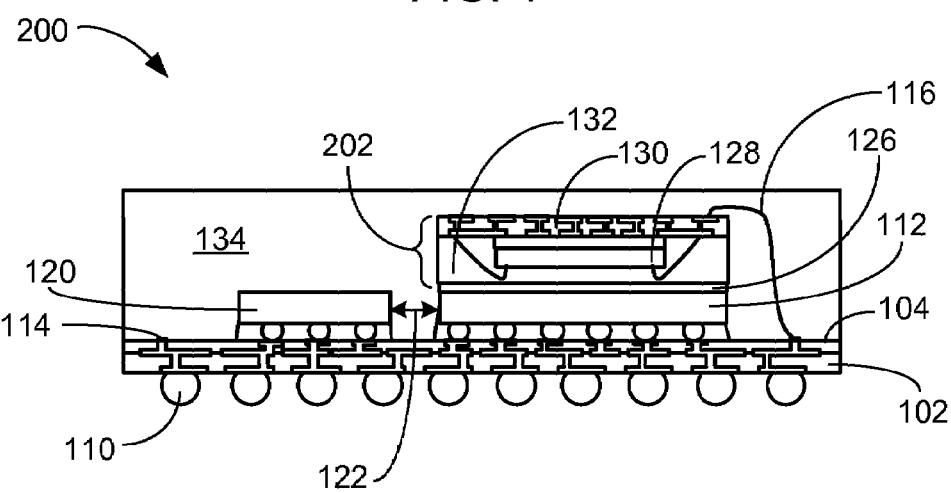
FIG. 2 is a cross-sectional view of an integrated circuit packaging system in a second embodiment of the present invention.

Referring now to FIG. 2, therein is shown a cross-sectional view of an integrated circuit packaging system 200 in a second embodiment of the present invention. The cross-sectional view of the integrated circuit packaging system 200 depicts the package substrate 102 having the first integrated circuit die 112 and the second integrated circuit die 120 mounted to the component side 104 and separated by the gap 122. An internal package 202 may be mounted over the first integrated circuit die 112 and held in position by the adhesive 126.

The internal package 202 may have one or more of the internal die 128 electrically connected to the internal package substrate 130 and encapsulated by the internal package body 132, such as formed from an epoxy molding compound. While the internal package 202 is shown with a single wire bond type of integrated circuit, this is an example only and other configurations are possible.

The internal package 202 may be coupled to the component side 104 of the package substrate 102 by the chip interconnects 116, such as bond wires. This configuration allows a signal connection to be formed between the system interconnects 110, the first integrated circuit die 112, the second integrated circuit die 120, the internal die 128, or the combination thereof.

The stacked package body 134 may be formed by molding the epoxy molding compound on the component side 104 of the package substrate 102, the first integrated circuit die 112, the second integrated circuit die 120, the internal package 202, the chip interconnects 116, the sealant 118, the adhesive 126, and through the gap 122. The stacked package body 134, while possibly formed of the same material as the internal package body 132, remains identifiably different from the internal package body 132 because their boundary can be identified in cross-section.

Figure 3:
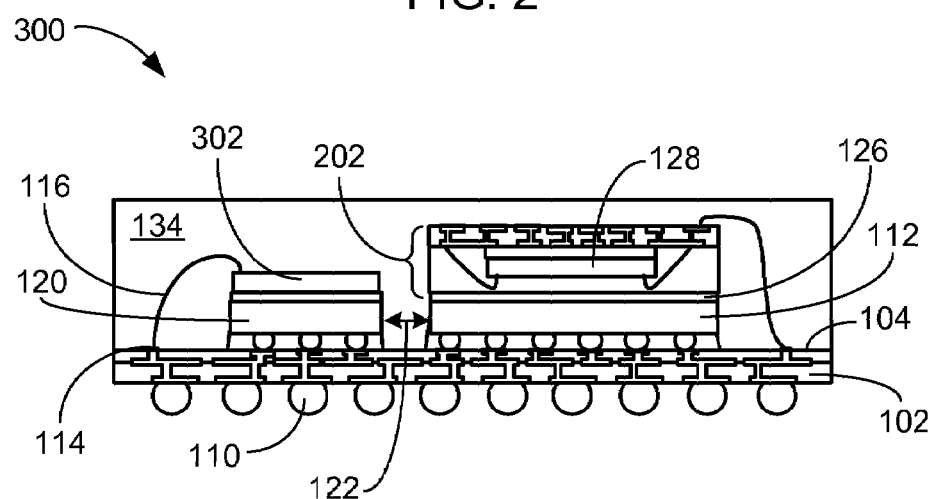
FIG. 3 is a cross-sectional view of an integrated circuit packaging system in a third embodiment of the present invention.

Referring now to FIG. 3, therein is shown a cross-sectional view of an integrated circuit packaging system 300 in a third embodiment of the present invention. The cross-sectional view of the integrated circuit packaging system 300 depicts the package substrate 102 having the first integrated circuit die 112 and the second integrated circuit die 120 mounted to the component side 104 and separated by the gap 122. The internal package 202 may be mounted over the first integrated circuit die 112 and held in position by the adhesive 126. A third integrated circuit die 302, such as a wire bond die, may be mounted over the second integrated circuit die 120 by the adhesive 126. The chip interconnect 116 may couple the third integrated circuit die 302 to the component contacts 114, on the component side 104 of the package substrate 102.

The internal package 202 may have one or more of the internal die 128 electrically connected to the internal package substrate 130 and encapsulated by the internal package body 132, such as formed from an epoxy molding compound. While the internal package 124 is shown with a single wire bond type of integrated circuit, this is an example only and other configurations are possible.

The internal package 202 may be coupled to the component side 104 of the package substrate 102 by the chip interconnect 116, such as a bond wire. This configuration allows a signal connection to be formed between the system interconnects 110, the first integrated circuit die 112, the second integrated circuit die 120, the third integrated circuit die 302, the internal die 128, or a combination thereof.

The stacked package body 134 may be formed by molding the epoxy molding compound on the component side 104 of the package substrate 102, the first integrated circuit die 112, the second integrated circuit die 120, the internal package 202, the chip interconnects 116, the sealant 118, the adhesive 126, and through the gap 122.

Figure 4:
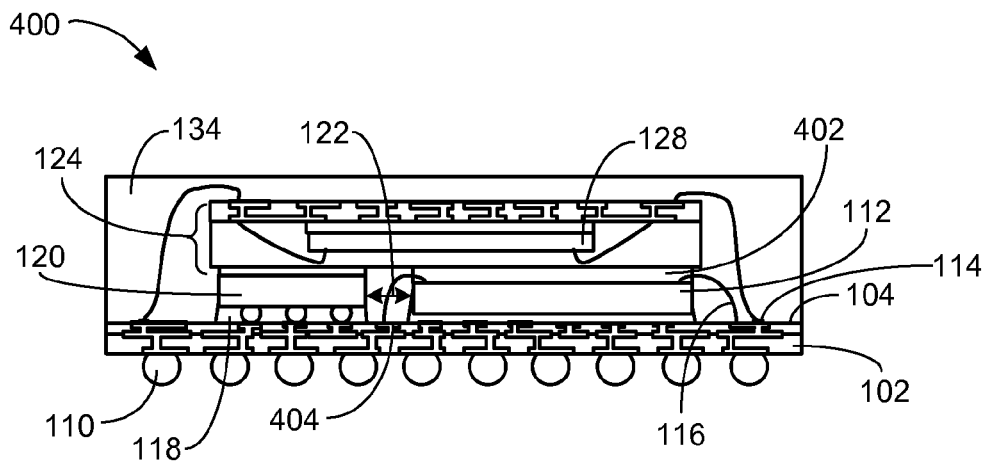
FIG. 4 is a cross-sectional view of an integrated circuit packaging system in a fourth embodiment of the present invention.

Referring now to FIG. 4, therein is shown a cross-sectional view of an integrated circuit packaging system 400 in a fourth embodiment of the present invention. The cross-sectional view of the integrated circuit packaging system 400 depicts the package substrate 102 having the first integrated circuit die 112, such as a wire bond die, and the second integrated circuit die 120 mounted to the component side 104 and separated by the gap 122. The first integrated circuit die 112 may be coupled to the component contacts 114 by the chip interconnects 116.

The first integrated circuit die 112 may be mounted on the component side 104 by the adhesive 126. The internal package 124 may be mounted over the first integrated circuit die 112, held in position by a wire in film adhesive 402 on the first integrated circuit die 112, and the second integrated circuit die 120, held in position by the adhesive 126.

A gap contact 404 may be coupled to the first integrated circuit die 112 by the chip interconnect 116. By coupling the first integrated circuit die 112 to the gap contact 404 an increased number of input/output interconnects is possible. This will further simplify the design of the system level substrate (not shown) by reducing the number of interconnect traces required in the system level substrate.

The internal package 124 may have one or more of the internal die 128 electrically connected to the internal package substrate 130 and encapsulated by the internal package body 132, such as formed from an epoxy molding compound. While the internal package 124 is shown with a single wire bond type of integrated circuit, this is an example only and other configurations are possible.

The internal package 124 may be coupled to the component side 104 of the package substrate 102 by the chip interconnect 116, such as a bond wire. This configuration allows a signal connection to be formed between the system interconnects 110, the first integrated circuit die 112, the second integrated circuit die 120, the internal die 128, or the combination thereof.

The stacked package body 134 may be formed by molding the epoxy molding compound on the component side 104 of the package substrate 102, the first integrated circuit die 112, the second integrated circuit die 120, the internal package 124, the chip interconnects 116, the sealant 118, the adhesive 126, the wire in film adhesive 402, and through the gap 122. The stacked package body 134, while possibly formed of the same material as the internal package body 132, remains identifiably different from the internal package body 132 because their boundary can be identified in cross-section.

Figure 5:
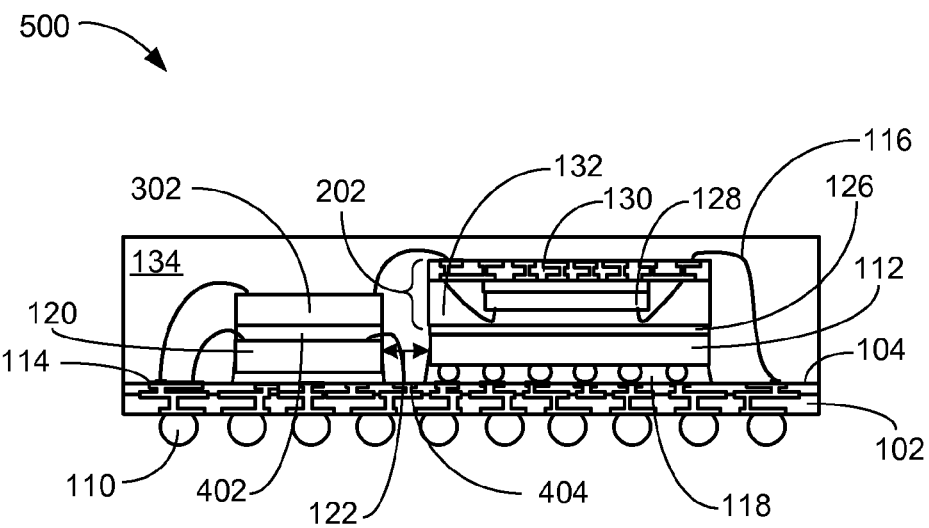
FIG. 5 is a cross-sectional view of an integrated circuit packaging system in a fifth embodiment of the present invention.

Referring now to FIG. 5, therein is shown a cross-sectional view of an integrated circuit packaging system 500 in a fifth embodiment of the present invention. The cross-sectional view of the integrated circuit packaging system 500 depicts the package substrate 102 having the first integrated circuit die 112 and the second integrated circuit die 120, such as a wire bond die, mounted to the component side 104 and separated by the gap 122. The internal package 202 may be mounted over the first integrated circuit die 112 and held in position by the adhesive 126.

The internal package 202 may have one or more of the internal die 128 electrically connected to the internal package substrate 130 and encapsulated by the internal package body 132, such as formed from an epoxy molding compound. While the internal package 202 is shown with a single wire bond type of integrated circuit, this is an example only and other configurations are possible.

The third integrated circuit die 302, such as a wire bond die, may be mounted over the second integrated circuit die 120 by the wire in film adhesive 402. The third integrated circuit die 302 can be the same size as the second integrated circuit die 120. The chip interconnects 116 may couple the third integrated circuit die 302 to the component contacts 114, the internal package 202, the gap contact 404, or a combination thereof.

The internal package 202 may be coupled to the component side 104 of the package substrate 102 by the chip interconnects 116, such as bond wires. This configuration allows a signal connection to be formed between the system interconnects 110, the first integrated circuit die 112, the second integrated circuit die 120, the third integrated circuit die 302, the internal die 128, or the combination thereof.

The stacked package body 134 may be formed by molding the epoxy molding compound on the component side 104 of the package substrate 102, the first integrated circuit die 112, the second integrated circuit die 120, the internal package 202, the chip interconnects 116, the sealant 118, the wire in film adhesive 402, the adhesive 126, and through the gap 122. The stacked package body 134, while possibly formed of the same material as the internal package body 132, remains identifiably different from the internal package body 132 because their boundary can be identified in cross-section.

Figure 6:
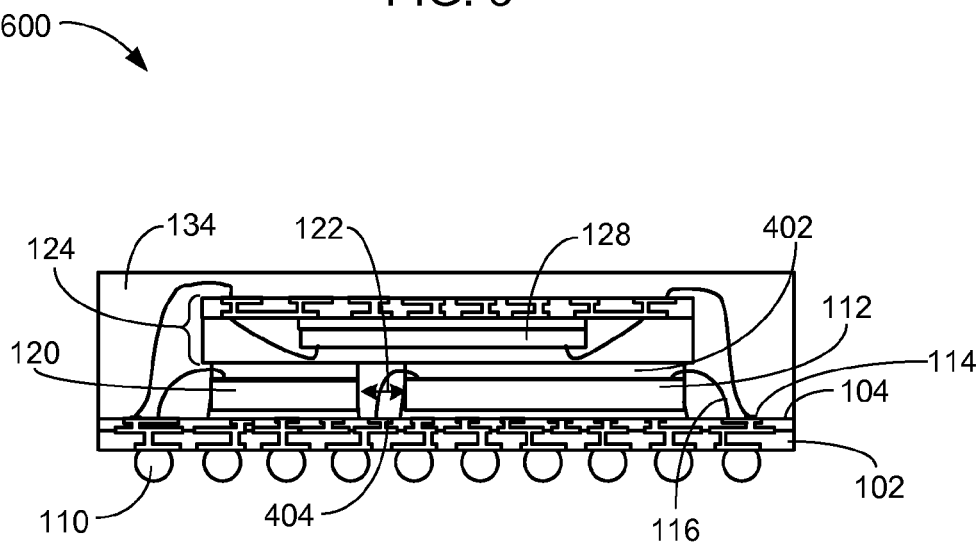
FIG. 6 is a cross-sectional view of an integrated circuit packaging system in a sixth embodiment of the present invention.

Referring now to FIG. 6, therein is shown a cross-sectional view of an integrated circuit packaging system 600 in a sixth embodiment of the present invention. The cross-sectional view of the integrated circuit packaging system 600 depicts the package substrate 102 having the first integrated circuit die 112, such as a wire bond die, and the second integrated circuit die 120 mounted to the component side 104 and separated by the gap 122. The first integrated circuit die 112 may be coupled to the component contacts 114 by the chip interconnects 116. The gap contacts 404 in the gap 122 may be coupled to the first integrated circuit die 112, the second integrated circuit die 120, or a combination thereof.

The first integrated circuit die 112 may be mounted on the component side 104 by the adhesive 126. The internal package 124 may be mounted over the first integrated circuit die 112 and the second integrated circuit die 120, held in position by the wire in film adhesive 402.

The internal package 124 may have one or more of the internal die 128 electrically connected to the internal package substrate 130 and encapsulated by the internal package body 132, such as formed from an epoxy molding compound. While the internal package 124 is shown with a single wire bond type of integrated circuit, this is an example only and other configurations are possible.

The internal package 124 may be coupled to the component side 104 of the package substrate 102 by the chip interconnect 116, such as a bond wire. This configuration allows a signal connection to be formed between the system interconnects 110, the first integrated circuit die 112, the second integrated circuit die 120, the internal die 128, or the combination thereof.

The stacked package body 134 may be formed by molding the epoxy molding compound on the component side 104 of the package substrate 102, the first integrated circuit die 112, the second integrated circuit die 120, the internal package 124, the chip interconnects 116, the wire in film adhesive 402, the adhesive 126, and through the gap 122. The stacked package body 134, while possibly formed of the same material as the internal package body 132, remains identifiably different from the internal package body 132 because their boundary can be identified in cross-section.

Figure 7:
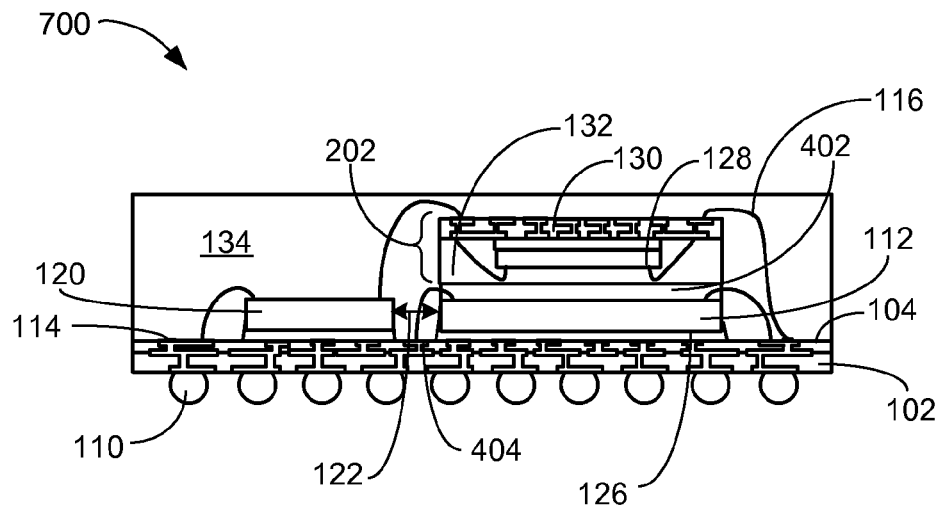
FIG. 7 is a cross-sectional view of an integrated circuit packaging system in a seventh embodiment of the present invention.

Referring now to FIG. 7, therein is shown a cross-sectional view of an integrated circuit packaging system 700 in a seventh embodiment of the present invention. The cross-sectional view of the integrated circuit packaging system 700 depicts the package substrate 102 having the first integrated circuit die 112 and the second integrated circuit die 120 mounted to the component side 104 and separated by the gap 122. The internal package 202 may be mounted over the first integrated circuit die 112 and held in position by the wire in film adhesive 402.

The internal package 202 may have one or more of the internal die 128 electrically connected to the internal package substrate 130 and encapsulated by the internal package body 132, such as formed from an epoxy molding compound. While the internal package 202 is shown with a single wire bond type of integrated circuit, this is an example only and other configurations are possible.

The internal package 202 may be coupled to the component contacts 114, the second integrated circuit die 120, the gap contacts 404, or a combination thereof by the chip interconnects 116, such as bond wires. The chip interconnects 116 are directly connected to the internal package 202 and the second integrated circuit die 120. The chip interconnects 116 are also directly connected to the internal package 202 and the package substrate 102. This configuration allows a signal connection to be formed between the system interconnects 110, the first integrated circuit die 112, the second integrated circuit die 120, the internal die 128, or the combination thereof.

The stacked package body 134 may be formed by molding the epoxy molding compound on the component side 104 of the package substrate 102, the first integrated circuit die 112, the second integrated circuit die 120, the internal package 202, the chip interconnects 116, the wire in film adhesive 402, the adhesive 126, and through the gap 122. The stacked package body 134, while possibly formed of the same material as the internal package body 132, remains identifiably different from the internal package body 132 because their boundary can be identified in cross-section.

Figure 8:
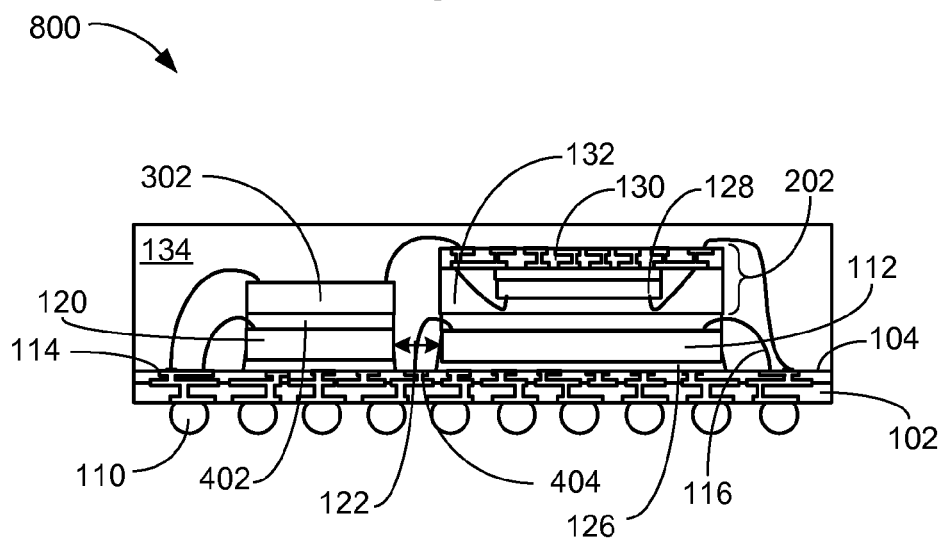
FIG. 8 is a cross-sectional view of an integrated circuit packaging system in an eighth embodiment of the present invention.

Referring now to FIG. 8, therein is shown a cross-sectional view of an integrated circuit packaging system 800 in an eighth embodiment of the present invention. The cross-sectional view of the integrated circuit packaging system 800 depicts the package substrate 102 having the first integrated circuit die 112 and the second integrated circuit die 120, such as wire bond die, mounted to the component side 104, by the adhesive 126, and separated by the gap 122. The internal package 202 may be mounted over the first integrated circuit die 112 and held in position by the wire in film adhesive 402.

The internal package 202 may have one or more of the internal die 128 electrically connected to the internal package substrate 130 and encapsulated by the internal package body 132, such as formed from an epoxy molding compound. While the internal package 202 is shown with a single wire bond type of integrated circuit, this is an example only and other configurations are possible.

The third integrated circuit die 302, such as a wire bond die, may be mounted over the second integrated circuit die 120 by the wire in film adhesive 402. The chip interconnects 116 may couple the third integrated circuit die 302 to the component contacts 114, the internal package 202, the gap contact 404, or a combination thereof.

The internal package 202 may be coupled to the component contacts 114, the gap contacts 404, the third integrated circuit die 302, or a combination thereof by the chip interconnects 116, such as bond wires. This configuration allows a signal connection to be formed between the system interconnects 110, the first integrated circuit die 112, the second integrated circuit die 120, the third integrated circuit die 302, the internal die 128, or the combination thereof.

The stacked package body 134 may be formed by molding the epoxy molding compound on the component side 104 of the package substrate 102, the first integrated circuit die 112, the second integrated circuit die 120, the internal package 202, the chip interconnects 116, the wire in film adhesive 402, the adhesive 126, and through the gap 122. The stacked package body 134, while possibly formed of the same material as the internal package body 132, remains identifiably different from the internal package body 132 because their boundary can be identified in cross-section.

Figure 9:
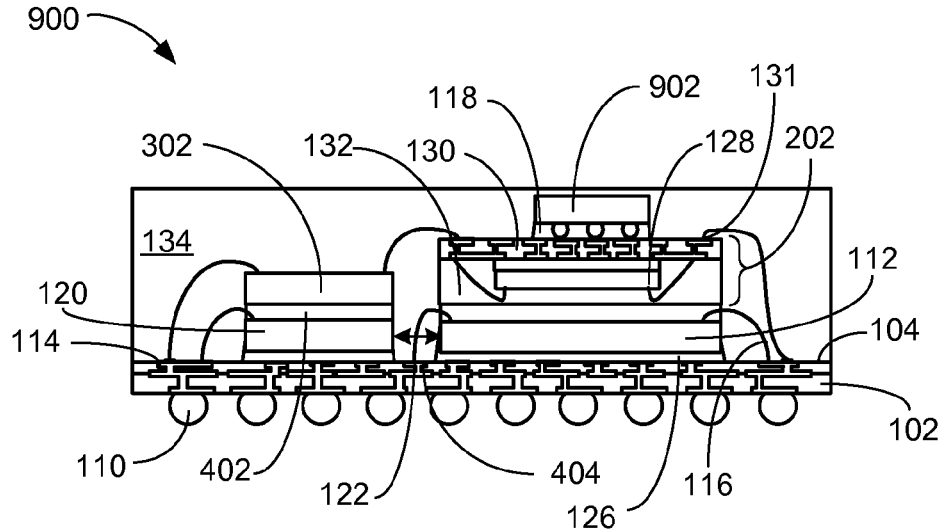
FIG. 9 is a cross-sectional view of an integrated circuit packaging system in a ninth embodiment of the present invention.

Referring now to FIG. 9, therein is shown a cross-sectional view of an integrated circuit packaging system 900 in a ninth embodiment of the present invention. The a cross-sectional view of the integrated circuit packaging system 900 depicts the package substrate 102 having the first integrated circuit die 112 and the second integrated circuit die 120, such as wire bond die, mounted to the component side 104, by the adhesive 126, and separated by the gap 122.

The internal package 202 may be mounted over the first integrated circuit die 112 and held in position by the wire in film adhesive 402. A fourth integrated circuit die 902, such as a flip chip die, may be mounted on the internal package contacts 131 of the internal package substrate 130 by the chip interconnects 116, such as solder balls.

The third integrated circuit die 302, such as a wire bond die, may be mounted over the second integrated circuit die 120 by the wire in film adhesive 402. The chip interconnects 116 may couple the third integrated circuit die 302 to the component contacts 114, the internal package 202, the gap contact 404, or a combination thereof.

The internal package 202 may be coupled to the component contacts 114, the gap contacts 404, the third integrated circuit die 302, or a combination thereof by the chip interconnects 116, such as bond wires. This configuration allows a signal connection to be formed between the system interconnects 110, the first integrated circuit die 112, the second integrated circuit die 120, the third integrated circuit die 302, the fourth integrated circuit die 902, the internal die 128, or the combination thereof.

The stacked package body 134 may be formed by molding the epoxy molding compound on the component side 104 of the package substrate 102, the first integrated circuit die 112, the second integrated circuit die 120, the internal package 202, the third integrated circuit die 302, the fourth integrated circuit die 902, the chip interconnects 116, the sealant 118, the adhesive 126, and through the gap 122. The stacked package body 134, while possibly formed of the same material as the internal package body 132, remains identifiably different from the internal package body 132 because their boundary can be identified in cross-section.

Figure 10:
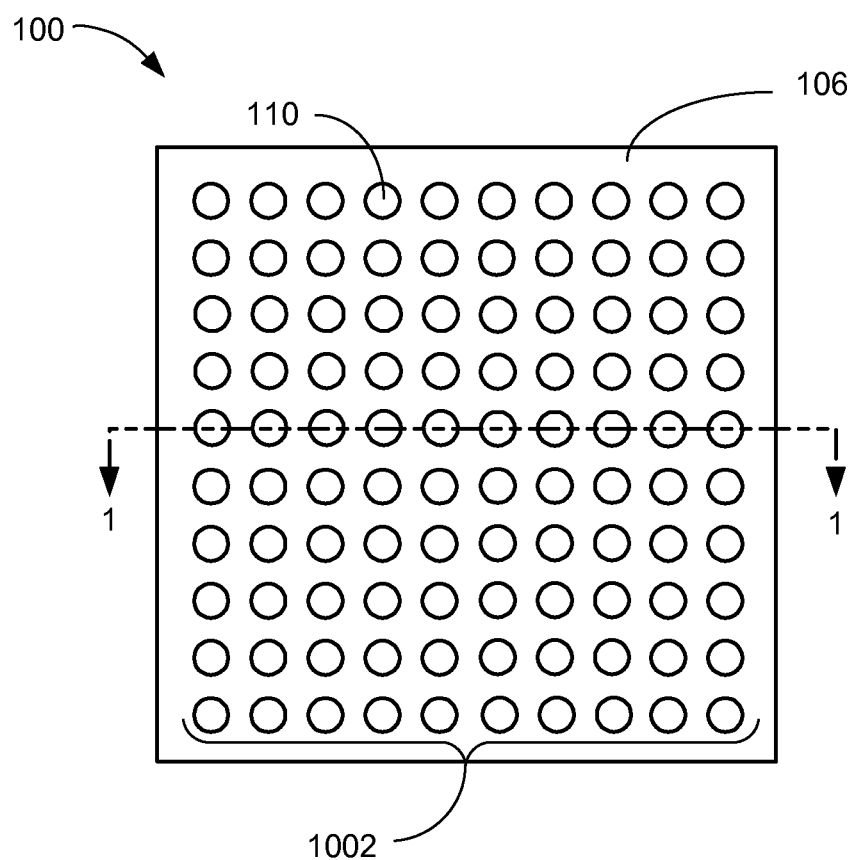
FIG. 10 is a bottom view of the integrated circuit packaging system.

Referring now to FIG. 10, therein is shown a bottom view of the integrated circuit packaging system 100. The bottom view of the integrated circuit packaging system 100 depicts an array 1002 of the system interconnects 110 on the system side 106. The section line 1-1 shows the position and direction of view for FIG. 1. This is also substantially the same cross-section as shown in FIGS. 2-9.

Figure 11:
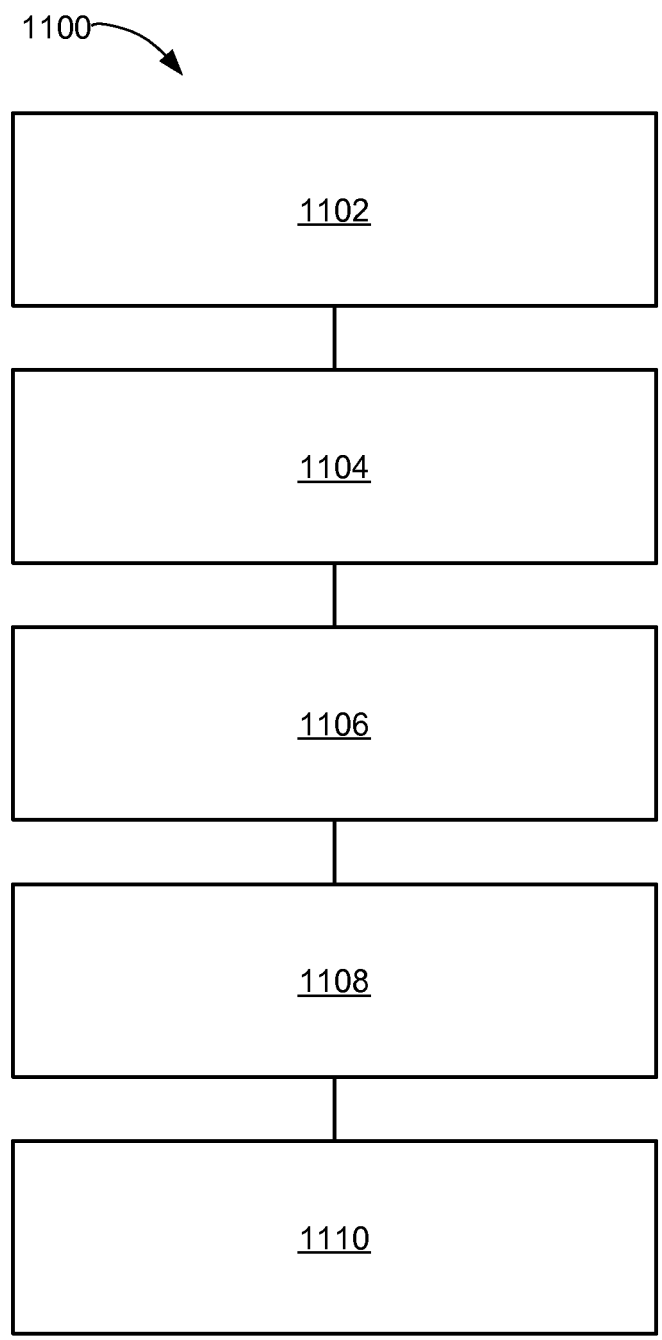
FIG. 11 is a flow chart of a method of manufacture of an integrated circuit packaging system in a further embodiment of the present invention.

Referring now to FIG. 11, therein is shown a flow chart of a method 1100 of manufacture of an integrated circuit packaging system 100 in a further embodiment of the present invention. The method 1100 includes: providing a package substrate, having a component side and a system side in a block 1102; mounting a first integrated circuit die on the component side of the package substrate in a block 1104; mounting a second integrated circuit die on the component side of the package substrate in a block 1106; mounting an internal package, having an internal die, over the first integrated circuit die; coupling chip interconnects between the first integrated circuit die, the second integrated circuit die, the internal die, the component side, or a combination thereof in a block 1108; and forming a stacked package body by encapsulating the component side, the first integrated circuit die, the second integrated circuit die, the internal package, and the chip interconnects in a block 1110.

The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing package-in-package systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing a package substrate, having a component side and a system side;
   mounting an integrated circuit die on the component side of the package substrate;
   mounting a yet another integrated circuit die on the package substrate, the yet another integrated circuit die having the same size as the another integrated circuit die;
   mounting an another integrated circuit die on the component side of the package substrate over the yet another integrated circuit die;

mounting an internal package with a wire in film adhesive over the integrated circuit die horizontally adjacent the another integrated circuit die, the internal package having an internal die, an internal package body, an internal package substrate having internal package contacts, and a further integrated circuit die on the internal package contacts, the internal package substrate coupled to the integrated circuit die, the another integrated circuit die, the further integrated circuit die, the internal die, the component side, or a combination thereof;

coupling a chip interconnect directly connected to the another integrated circuit die and the internal package;

coupling another chip interconnect directly connected to the internal package and the package substrate; and forming a stacked package body by fully encapsulating the component side, the integrated circuit die, the another integrated circuit die, the internal package, the chip interconnect, and the internal package contacts.

2. The method as claimed in claim 1 wherein mounting the internal package includes:
fabricating the internal package substrate for mounting the internal die; and
molding the internal package body on the internal die and the internal package substrate.

3. The method as claimed in claim 1 further comprising forming a gap, on the component side, by mounting the another integrated circuit die spaced away from the integrated circuit die.

4. The method as claimed in claim 1 wherein:
mounting the internal package includes mounting the further integrated circuit die to the package substrate; and
mounting the another integrated circuit die includes mounting the another integrated circuit die over the further integrated circuit die.

5. A method of manufacture of an integrated circuit packaging system comprising:
providing a package substrate, having a component side with component contacts and a system side with system contacts;
forming system interconnects on the system contacts including forming a signal connection between the system interconnects and the component contacts on the component side;
mounting an integrated circuit die on the component side of the package substrate including applying an adhesive or a sealant between the component side and the integrated circuit die;
mounting a yet another integrated circuit die on the package substrate, the yet another integrated circuit die having the same size as the another integrated circuit die;
mounting an another integrated circuit die on the component side of the package substrate over the yet another integrated circuit die;
mounting an internal package with a wire in film adhesive over the integrated circuit die horizontally adjacent the another integrated circuit die, the internal package having an internal die, an internal package body, an internal package substrate having internal package contacts, and a further integrated circuit die on the internal package contacts, the internal package substrate coupled to the integrated circuit die, the another integrated circuit die, the further integrated circuit die, the internal die, the component side, or a combination thereof, the internal package contacts on a side of the internal package exposed from the internal package body and opposite of the integrated circuit die including applying a wire in film adhesive or the adhesive between the internal package and the integrated circuit die;

coupling a chip interconnect directly connected to the another integrated circuit die and the internal package;

coupling another chip interconnect directly connected to the internal package and the package substrate; and forming a stacked package body by fully encapsulating the component side, the integrated circuit die, the another integrated circuit die, the internal package, the chip interconnects and the internal package contacts.

6. The method as claimed in claim 5 wherein mounting the internal package includes:
fabricating the internal package substrate for mounting the internal die including forming the internal package contacts through the internal package substrate; and
molding the internal package body on the internal die and the internal package substrate.

7. The method as claimed in claim 5 further comprising forming a gap, on the component side, by mounting the another integrated circuit die spaced away from the integrated circuit die and forming a gap contact in the gap.

8. The method as claimed in claim 5 wherein:
mounting the internal package includes mounting the further integrated circuit die to the package substrate; and
the another integrated circuit die is a wire bond die coupled to the component contacts, the internal package, the integrated circuit die, the further integrated circuit die, or a combination thereof.

9. An integrated circuit packaging system comprising:
a package substrate, having a component side and a system side;
an integrated circuit die mounted on the component side of the package substrate;
an another integrated circuit die mounted over the component side of the package substrate;
a yet another integrated circuit die under the another integrated circuit die, the yet another integrated circuit die having the same size as the another integrated circuit die;
a wire in film adhesive on the integrated circuit die;
an internal package mounted with the wire in film adhesive over the integrated circuit die horizontally adjacent the another integrated circuit die, the internal package having an internal die, an internal package body, an internal package substrate having internal package contacts, and a further integrated circuit die on the internal package contacts, the internal package substrate coupled to the integrated circuit die, the another integrated circuit die, the further integrated circuit die, the internal die, the component side, or a combination thereof;
a chip interconnect directly connected to the another integrated circuit die and the internal package;
another chip interconnect directly connected to the internal package and the package substrate; and
a stacked package body fully encapsulating the component side, the integrated circuit die, the another integrated circuit die, the internal package, the chip interconnect, and the internal package contacts.

10. The system as claimed in claim 9 wherein the internal package mounted includes:
the internal package body molded on the internal die and the internal package substrate.

11. The system as claimed in claim 9 wherein:
the integrated circuit die is on the component side; and
the another integrated circuit die is positioned with a gap therebetween.

12. The system as claimed in claim 9 wherein:
the further integrated circuit die is mounted to the package substrate; and
the another integrated circuit die is over the further integrated circuit die.

13. The system as claimed in claim 9 wherein:
the package substrate includes component contacts on the component side and system contacts on the system side; and further comprising:
system interconnects on the system contacts coupled to the component contacts; and
an adhesive or a sealant between the integrated circuit die and the component side.

14. The system as claimed in claim 13 wherein the internal package mounted includes:
the internal package contacts through the internal package substrate; and
the internal package body molded on the internal die and the internal package substrate.

15. The system as claimed in claim 13 wherein the integrated circuit die, on the component side, and the another integrated circuit die are positioned with a gap therebetween includes a gap contact in the gap.

16. The system as claimed in claim 13 wherein:
the another integrated circuit die is a wire bond die coupled to the component contacts, the internal package, the integrated circuit die, the further integrated circuit die, or a combination thereof.

* * * * *